United States Patent
Bak et al.

(10) Patent No.: US 8,052,307 B2
(45) Date of Patent: Nov. 8, 2011

(54) LENS AND LIGHT EMITTING APPARATUS HAVING THE SAME

(75) Inventors: Gyu Hyeong Bak, Seoul (KR); Sang Won Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/875,671

(22) Filed: Sep. 3, 2010

(65) Prior Publication Data
US 2011/0116272 A1    May 19, 2011

(30) Foreign Application Priority Data
Nov. 19, 2009 (KR) .................. 10-2009-0112279

(51) Int. Cl.
*H01L 33/00* (2010.01)
(52) U.S. Cl. ............. 362/257; 362/311.01; 362/311.02; 362/249.02; 362/308; 362/296.05
(58) Field of Classification Search .......... 362/311.01, 362/311.02, 311.06, 308, 309, 249.02, 275, 362/800
See application file for complete search history.

(56) References Cited

U.S. PATENT DOCUMENTS

| | | | | |
|---|---|---|---|---|
| 7,119,964 B2 * | 10/2006 | Kim et al. | ...................... | 359/626 |
| 7,549,781 B2 * | 6/2009 | Kim et al. | ...................... | 362/555 |
| 7,602,559 B2 * | 10/2009 | Jang et al. | ...................... | 359/726 |
| 2004/0207999 A1 | 10/2004 | Suehiro et al. | ................... | 362/84 |
| 2008/0303757 A1 | 12/2008 | Ohkawa et al. | .................. | 345/82 |
| 2009/0296407 A1 * | 12/2009 | Bailey | ............................ | 362/309 |
| 2010/0195335 A1 * | 8/2010 | Allen et al. | .................... | 362/309 |

FOREIGN PATENT DOCUMENTS

| | | |
|---|---|---|
| EP | 1 717 627 A1 | 11/2006 |
| JP | 2009-152142 A | 7/2009 |
| KR | 10-0706942 B1 | 4/2007 |
| KR | 10-0869573 B1 | 11/2008 |
| KR | 10-2009-0059877 A | 6/2009 |
| WO | WO 2008/104936 A2 | 9/2008 |

OTHER PUBLICATIONS

Korean Office Action dated Apr. 5, 2010 issued in Application No. 10-2009-0112279.
Korean Notice of Allowance dated Jul. 23, 2010 issued in Application No. 10-2009-0112279.
European Search Report dated Dec. 20, 2010 issued in Application No. 10 17 5788.

* cited by examiner

*Primary Examiner* — Anabel Ton
(74) *Attorney, Agent, or Firm* — KED & Associates, LLP

(57) ABSTRACT

Provided are a lens and a light emitting apparatus comprising the lens. The light emitting apparatus comprises a substrate, a light emitting device package on the substrate, and a lens supported by the substrate, the lens being disposed on the light emitting device package. The lens comprises a lens body comprising a first recessed part at a central portion of a top surface thereof and a second recessed part at a central portion of a bottom surface thereof and a lens support disposed on the bottom surface of the lens body to support the lens body such that the bottom surface of the lens body is spaced from the substrate.

23 Claims, 5 Drawing Sheets

LENS AND LIGHT EMITTING APPARATUS HAVING THE SAME

CROSS-REFERENCE TO RELATED APPLICATIONS

The present application claims priority under 35 U.S.C. §119(e) of Korean Patent Application No. 10-2009-0112279 (filed on Nov. 19, 2009), which is hereby incorporated by reference in its entirety.

BACKGROUND

The present disclosure relates to a lens and a light emitting apparatus including the lens.

Light emitting devices such as light emitting diodes have advantages of low power consumption, a long usable life cycle, and environmental friendly. Thus, the light emitting devices are being used for various light emitting apparatuses such as backlight units for electronic equipment, electronic displays, and lighting equipment.

In such a light emitting apparatus, a sealing resin layer is formed in various lens shapes to surround a light emitting device, thereby to adjust a distribution characteristic of light emitted from the light emitting device.

SUMMARY

Embodiments provide a light emitting apparatus having a novel structure.

Embodiments also provide a light emitting apparatus including a lens having a novel structure.

Embodiments also provide a light emitting apparatus having a superior light emitting characteristic in a lateral direction.

In one embodiment, a light emitting apparatus comprises: a substrate; a light emitting device package on the substrate; and a lens supported by the substrate, the lens being disposed on the light emitting device package, wherein the lens comprises a lens body comprising a first recessed part at a central portion of a top surface thereof and a second recessed part at a central portion of a bottom surface thereof and a lens support disposed on the bottom surface of the lens body to support the lens body such that the bottom surface of the lens body is spaced from the substrate.

In another embodiment, a lens comprises: a lens body having a convex top surface comprising a first recessed part at a central portion thereof and a flat surface at a circumference thereof and a flat bottom surface comprising a second recessed part at a central portion thereof; and a plurality of lens supports on the bottom surface of the lens body, wherein a ratio of a maximum depth of the first recessed part to a maximum thickness of the lens body ranges from about 0.06 to about 0.1, a ratio of a maximum depth of the second recessed part to a maximum thickness of the lens body ranges from about 0.5 to 0.75, and a ratio of a maximum depth of the second recessed part to a maximum depth of the first recessed part ranges from about 6.25 to about 10, and a ratio of a maximum width of the first recessed part to a maximum width of the lens body ranges from about 0.18 to about 0.3, a ratio of a maximum width of the second recessed part to a maximum width of the lens body ranges from about 0.14 to about 0.25, and a ratio of a maximum width of the second recessed part to a maximum width of the first recessed part ranges from about 0.7 to about 0.94.

The details of one or more embodiments are set forth in the accompanying drawings and the description below. Other features will be apparent from the description and drawings, and from the claims.

DETAILED DESCRIPTION OF THE EMBODIMENTS

Figure 1:
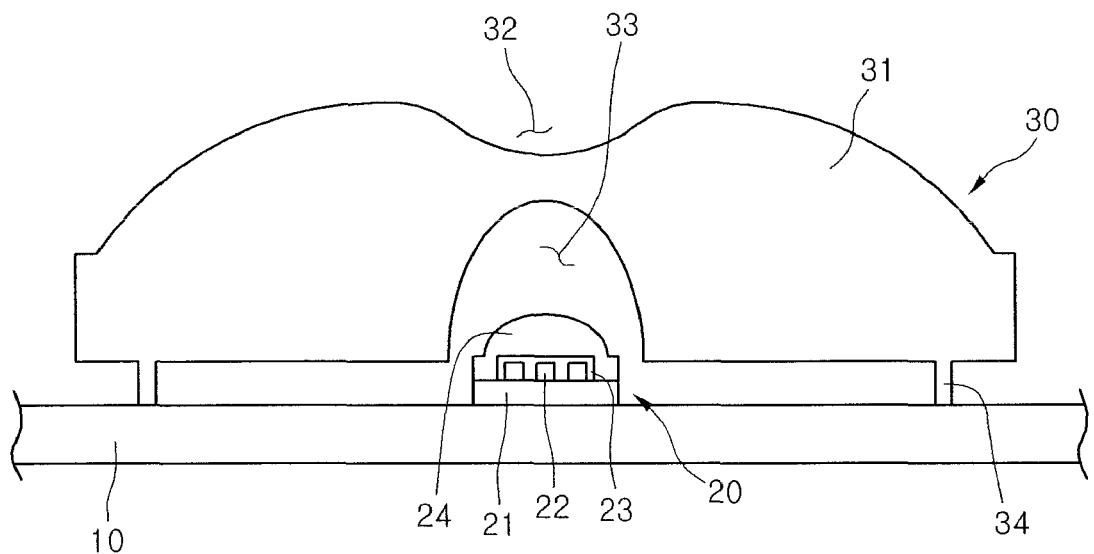
FIGS. 1 and 2 are sectional views of a light emitting apparatus according to a first embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'.

In the drawings, the thickness or size of each layer is exaggerated, omitted, or schematically illustrated for convenience in description and clarity. Also, the size of each element does not entirely reflect an actual size.

Figure 2:
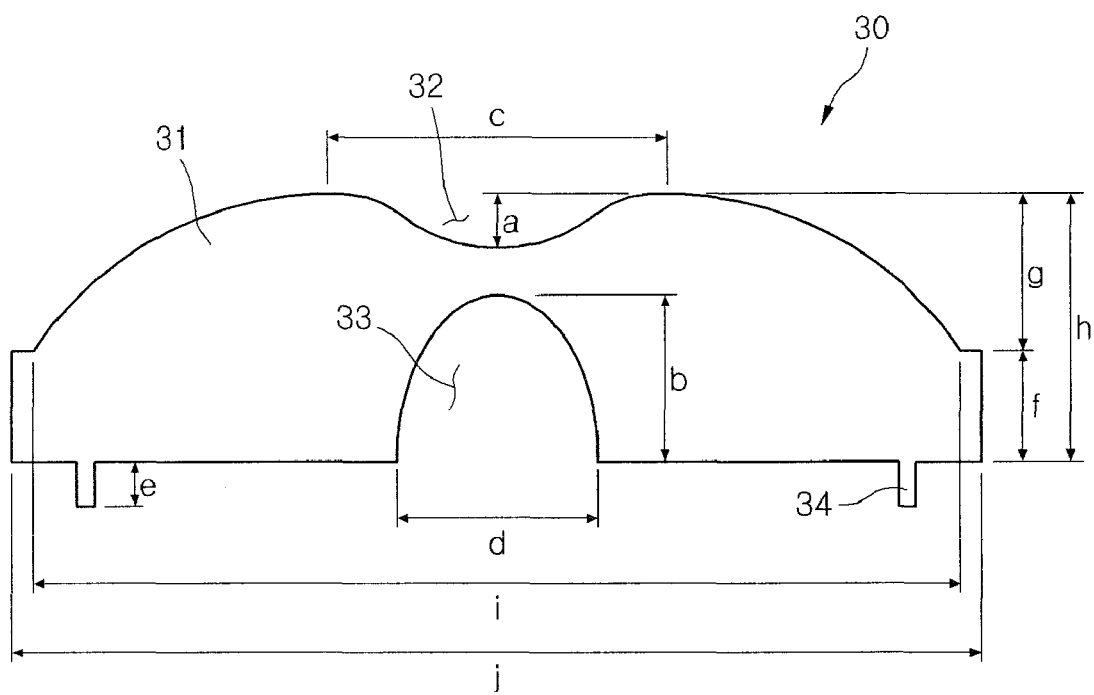

FIGS. 1 and 2 are sectional views of a light emitting apparatus according to a first embodiment.

Referring to FIGS. 1 and 2, a light emitting apparatus according to a first embodiment includes a substrate 10, a light emitting device package 20 disposed on the substrate 10, and a lens 30 disposed and supported on the substrate 10 and disposed on the light emitting device package 20.

The substrate 10 may be a printed circuit board (PCB). A circuit pattern (not shown) is disposed on the substrate 10, and the circuit pattern and the light emitting device package 20 are electrically connected to each other. Also, the substrate 10 may be a metal core printed circuit board (MCPCB).

The light emitting device package 20 includes a package body 21, at least one light emitting device 22 disposed on the package body 21, a phosphor layer 23 surrounding the light emitting device 22, and a sealing resin layer 24 surrounding the phosphor layer 23 on the package body 21.

Electrode layers (not shown) are disposed on the package body 21. The electrode layers pass through the package body 21 or disposed on a surface of the package body 21 to electrically connect the light emitting device 22 to the circuit pattern of the substrate 10. The package body 21 may be formed of various materials. For example, the package body 21 may be formed of one of a ceramic material, a resin material, and a silicon material.

The light emitting device 22 may include a light emitting diode. The light emitting device 22 may be provided in plurality on the package body 21. In this embodiment, three light emitting devices 22 are provided. The plurality of light emitting devices 22 may be connected to each other in parallel or series. Also, the plurality of light emitting devices 22 may be electrically connected to the electrode layers using a flip-chip method or a wire bonding method.

A light emitting diode emitting at least one of red light, green light, and blue light may be used as the light emitting device 22. In this embodiment, the light emitting diode emitting the blue light is illustrated as an example.

The phosphor layer 23 may surround the light emitting device 22 on the package body 21. For example, the phosphor layer 23 may contain a yellow phosphor. The phosphor layer 23 may have a flat top surface and a constant height on the package body 21.

The sealing resin layer 24 is disposed on the package body 21 to surround the phosphor layer 23. The sealing resin layer 24 may be formed of a transparent resin material, for example, an epoxy resin or a silicon resin.

The sealing resin layer 24 may protrude from a central portion of a top surface thereof. Also, the sealing resin layer 24 may be flat at a circumference of the top surface.

Although the phosphor layer 23 and the sealing resin layer 24 are separated from each other in this embodiment, the present disclosure is not limited thereto. For example, a phosphor may be dispersed into the sealing resin layer 24 on the whole without separating the phosphor layer 23 from the sealing resin layer 24.

The lens 30 includes a lens body 31 and a lens support 34 supporting the lens body 31. The lens body 31 and the lens support 34 may be integrated with each other using an injection molding. Alternatively, the lens body 31 and the lens support 34 may be provided as separate parts, and then coupled to each other using an adhesive.

The lens body 31 may have an approximately circular shape in plan view. A concave-convex part or roughness may be disposed on a bottom surface of the lens body 31. The concave-convex part or roughness may be disposed on the bottom surface of the lens body 31 except for a portion where a second recessed part 33 is formed.

The lens support 34 may be provided in plurality on the bottom surface of the lens body 31. Although only two lens supports 34 are illustrated in this embodiment, the present disclosure is not limited thereto. For example, three or more lens supports 34 may be disposed spaced from each other to stably support the lens body 31. A configuration or number of the lens support 34 may be variously modified according to its design.

The lens support 34 may have a gap between the lens body 31 and the substrate 10. Thus, air may flow through the gap to easily release heat generated in the light emitting device.

The lens support 34 may be supported by a top surface of the substrate 10. A bottom surface of the lens support 34 may contact only the top surface of the substrate 10.

Although only one lens 30 is disposed on the substrate 10 in this embodiment, a plurality of lenses may be disposed on the substrate 10.

The lens body 31 may be formed of a transparent resin material. Also, the lens body 31 may be spaced a predetermined distance from the substrate 10 by the lens support 34. The lens support 34 may be firmly attached to the substrate 10 using an adhesive.

The lens body 31 has a protruding top surface on the whole. A downwardly concave first recessed part 32 is disposed at a central portion of the top surface of the lens body 31. Also, the lens body 31 has a flat bottom surface. An upward concave second recessed part 33 is disposed at a central portion of the bottom surface of the lens body 31. The first recessed part 32 and the second recessed part 33 vertically overlap each other.

Since the first recessed part 32 and the second recessed part 33 are disposed at the central portion of the lens body 31, the lens body 31 has a thin thickness at the central portion thereof. The lens body 31 has a thickness which becomes gradually thicker from the central portion toward an edge portion and then thinner again. Also, a circumference of the top surface of the lens body 31 may be flat, and a lateral surface adjacent to the bottom surface of the lens body 31 may be perpendicular to the bottom surface of the lens body 31.

The first recessed part 32 may have a maximum depth (a) of about 0.3 mm to about 0.4 mm. The second recessed part 33 may have a maximum depth (b) of about 2.5 mm to about 3 mm. Also, the first recessed part 32 may have a maximum width (c) of about 3.5 mm to about 4 mm. The second recessed part 33 may have a maximum width (d) of about 2.8 mm to about 3 mm.

The lens support 34 may have a maximum thickness (e) of about 0.5 mm to about 0.8 mm.

The lens body 31 may have a maximum thickness (h) of about 4 mm to about 5 mm. A maximum thickness (f) from the bottom surface of the lens body 31 to the flat top surface may range from about 1.8 mm to about 2 mm. A thickness (g) from the flat top surface of the lens body 31 to a top surface may range from about 2.2 mm to about 2.8 mm.

The lens body 31 may have a maximum width (j) of about 13 mm to about 19 mm. The lens body may have a maximum width (i) of about 12 mm to about 18 mm at a portion in which the top surface of the lens body 31 is curved.

In the light emitting device package 20, the package body 21 may have a maximum thickness of about 0.3 mm to about 0.4 mm, and a maximum height from the top surface of the package body 21 to a top surface of the sealing resin layer 24 may range from about 1.1 mm to about 1.5 mm.

In this embodiment, a ratio (a/h) of the maximum depth (a) of the first recessed part 32 to the maximum thickness (h) of the lens body 31 may range from about 0.06 to about 0.1. A ratio (b/h) of the maximum depth (b) of the second recessed part 33 to the maximum thickness (h) of the lens body 31 may range from about 0.5 to 0.75. A ratio (b/a) of the maximum depth (b) of the second recessed part 33 to the maximum depth (a) of the first recessed part 32 may range from about 6.25 to about 10.

A ratio (c/j) of the maximum width (c) of the first recessed part 32 to the maximum width (j) of the lens body 31 may range from about 0.18 to about 0.3. A ratio (d/j) of the maximum width (d) of the second recessed part 33 to the maximum width (j) of the lens body 31 may range from about 0.14 to about 0.25. A ratio (d/c) of the maximum width (d) of the second recessed part 33 to the maximum width (c) of the first recessed part 32 may range from about 0.7 to about 0.94.

At least portion of the sealing resin layer 24 is disposed within the second recessed part 33. The package body 21 has the maximum thickness less than that of the lens support 34. The bottom surface of the lens body 31 may be flush with the light emitting device 22 or the phosphor layer 23 or flush with the sealing resin layer 24.

As above-described, the light emitting apparatus has superior light emitting efficiency in a lateral direction. Light emitted from the light emitting device 22 is reflected and refracted by the sealing resin layer 24 and reflected and refracted by the second recessed part 33 to emit a large amount of the light in the lateral direction. Specifically, the first recessed part 32 and the second recessed part 33 reduce an amount of light emitted in an upper direction.

Figure 9:
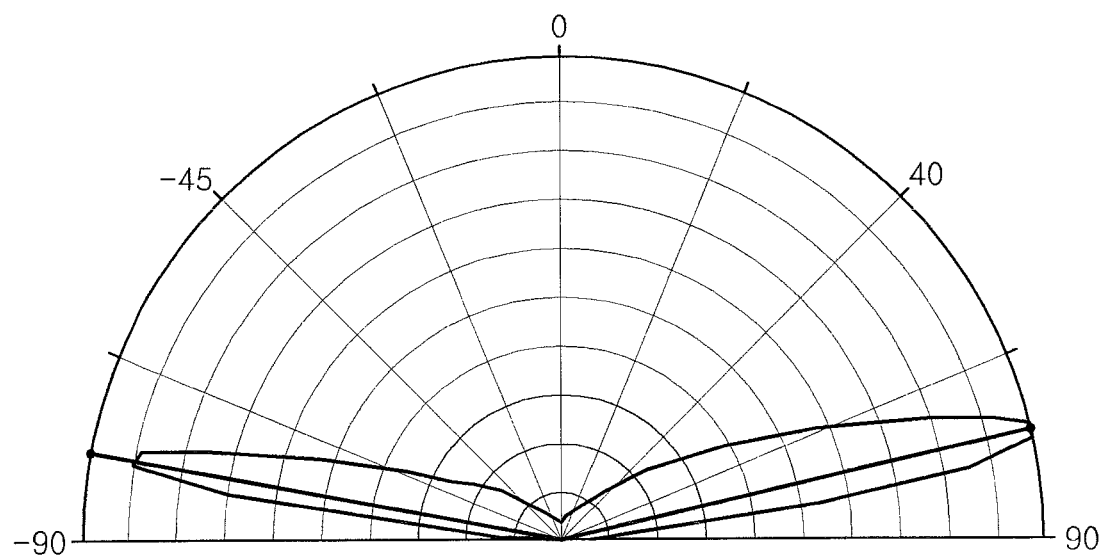
FIGS. 9 and 10 are views illustrating a light distribution characteristic of the light emitting apparatus according to the first embodiment.
Figure 10:
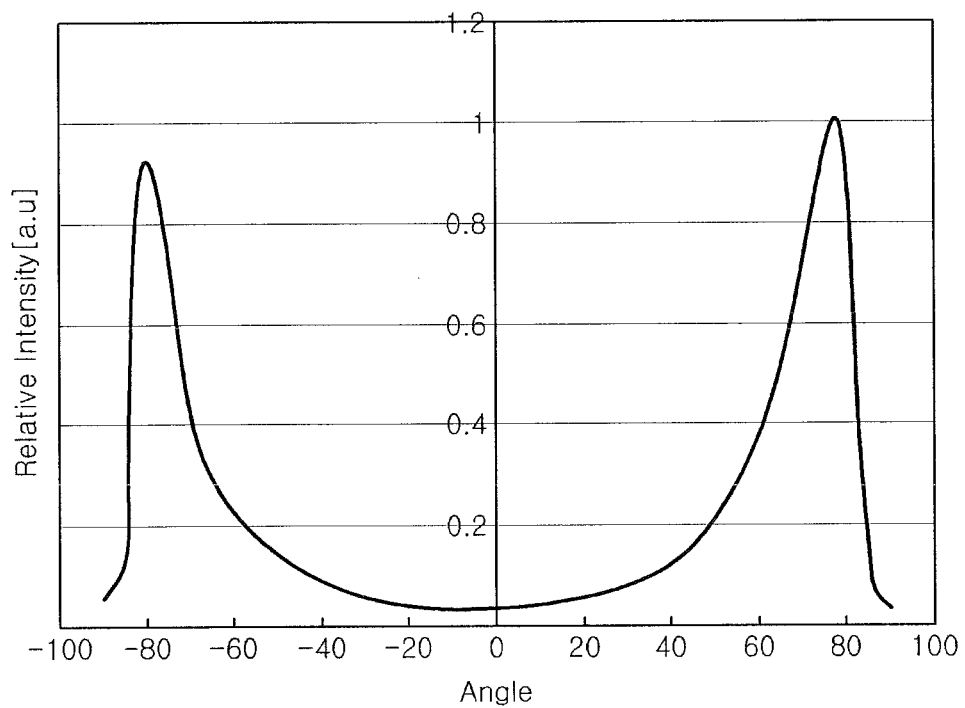

FIGS. 9 and 10 are views illustrating a light distribution characteristic of the light emitting apparatus according to the first embodiment.

Referring to FIGS. 9 and 10, the light emitting apparatus according to the first embodiment emits a peak light at an angle of about 70° to about 85° or about −70° to about −85° when an angle perpendicular to the substrate 10 is defined as 0°. That is, it may be seen that the light emitted from the light emitting apparatus is mainly emitted in the lateral direction.

Hereinafter, light emitting apparatuses according to second to seventh embodiments have light distribution characteristics similar to that of the light emitting apparatus of FIGS. 9 and 10.

Figure 3:
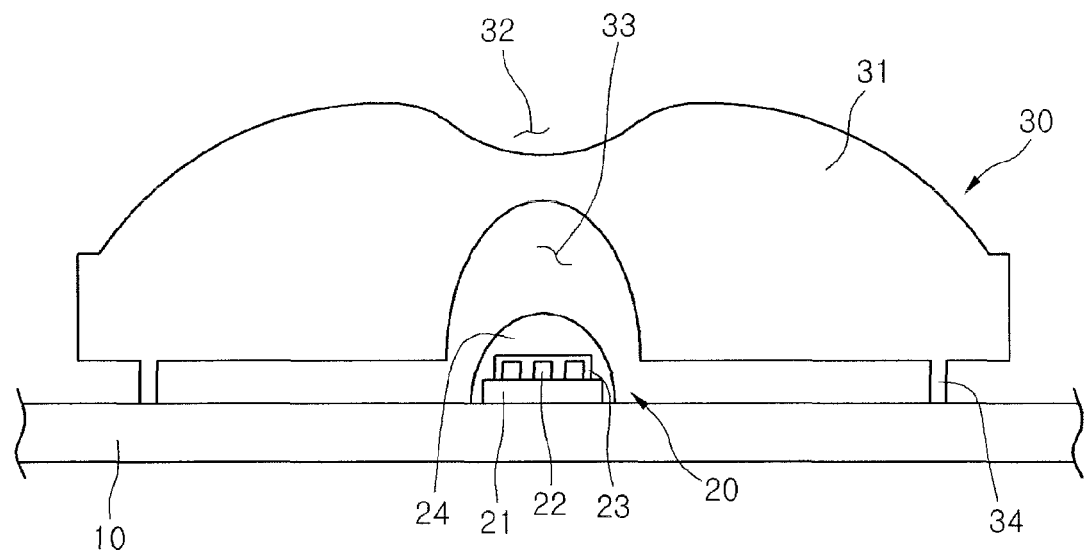
FIG. 3 is a sectional view of a light emitting apparatus according to a second embodiment.

FIG. 3 is a sectional view of a light emitting apparatus according to a second embodiment.

In descriptions of a light emitting apparatus according to a second embodiment, descriptions that duplicate those for the light emitting apparatus according to the first embodiment will be omitted.

Referring to FIG. 3, in a light emitting apparatus according to a second embodiment, a light emitting device package 20 includes a sealing resin layer 24 contacting a substrate 10. The sealing resin layer 24 is disposed on the substrate 10, a package body 21, and a phosphor layer 23. Since the sealing resin layer 24 contacts the substrate 10 and a lateral surface of the package body 21, a contact area therebetween increases. Thus, the sealing resin layer 24 may be firmly coupled.

Figure 4:
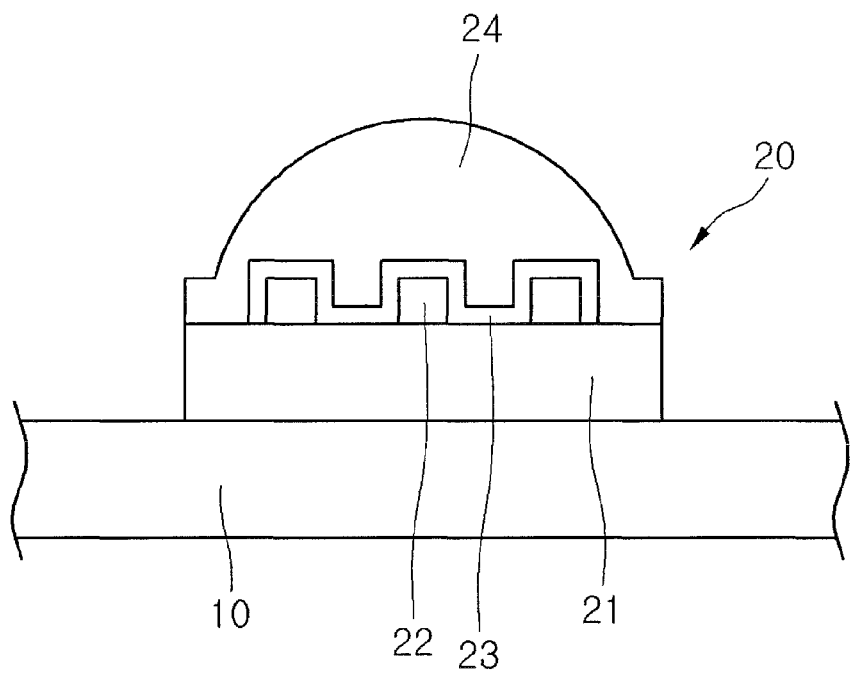
FIG. 4 is a sectional view of a light emitting device package in a light emitting apparatus according to a third embodiment.

FIG. 4 is a sectional view of a light emitting device package in a light emitting apparatus according to a third embodiment.

In descriptions of a light emitting apparatus according to a third embodiment, descriptions that duplicate those for the light emitting apparatus according to the first embodiment will be omitted.

Referring to FIG. 4, in a light emitting apparatus according to a third embodiment, a light emitting device package 20 includes a package body 21 and a phosphor layer 23 having a constant thickness on a light emitting device 22. The phosphor layer 23 may have a curved shape according to an arrangement of the light emitting device 22. That is, the phosphor layer 23 disposed on the package body 21 may have a height less than that of the phosphor layer 23 disposed on the light emitting device 22. In the light emitting apparatus according to the third embodiment, since the phosphor layer 23 surrounds the light emitting device 22 at the constant thickness, a color variation of light emitted from the light emitting apparatus may be reduced.

Figure 5:
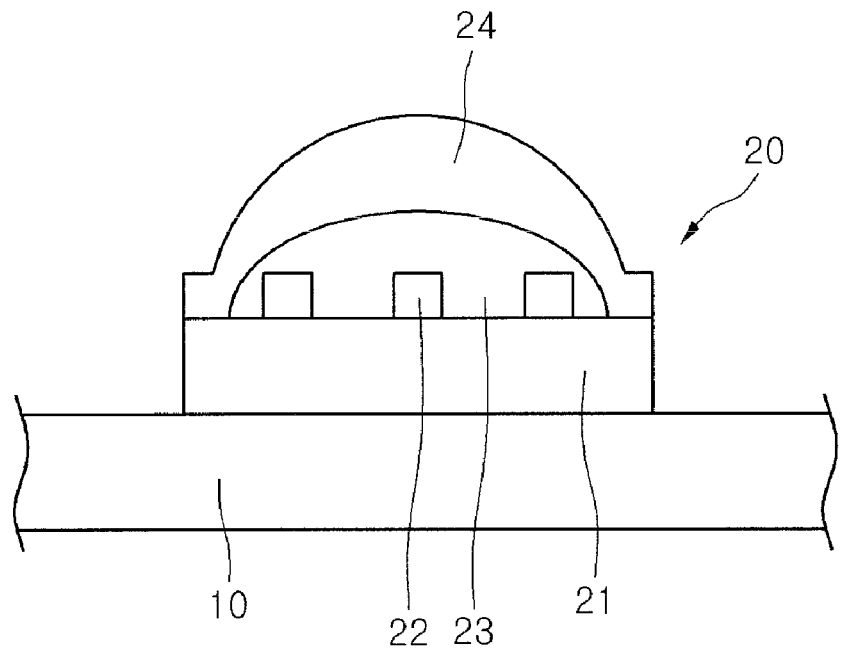
FIG. 5 is a sectional view of a light emitting device package in a light emitting apparatus according to a fourth embodiment.

FIG. 5 is a sectional view of a light emitting device package in a light emitting apparatus according to a fourth embodiment.

In descriptions of a light emitting apparatus according to a fourth embodiment, descriptions that duplicate those for the light emitting apparatus according to the first embodiment will be omitted.

Referring to FIG. 5, in a light emitting apparatus according to a fourth embodiment, a light emitting device package 20 includes a package body 21 and a phosphor layer 23 having a convex shape and disposed on a light emitting device 22.

In the light emitting apparatus according to the fourth embodiment, since the phosphor layer 23 is formed using a dispensing method, its manufacturing process is simple.

Figure 6:
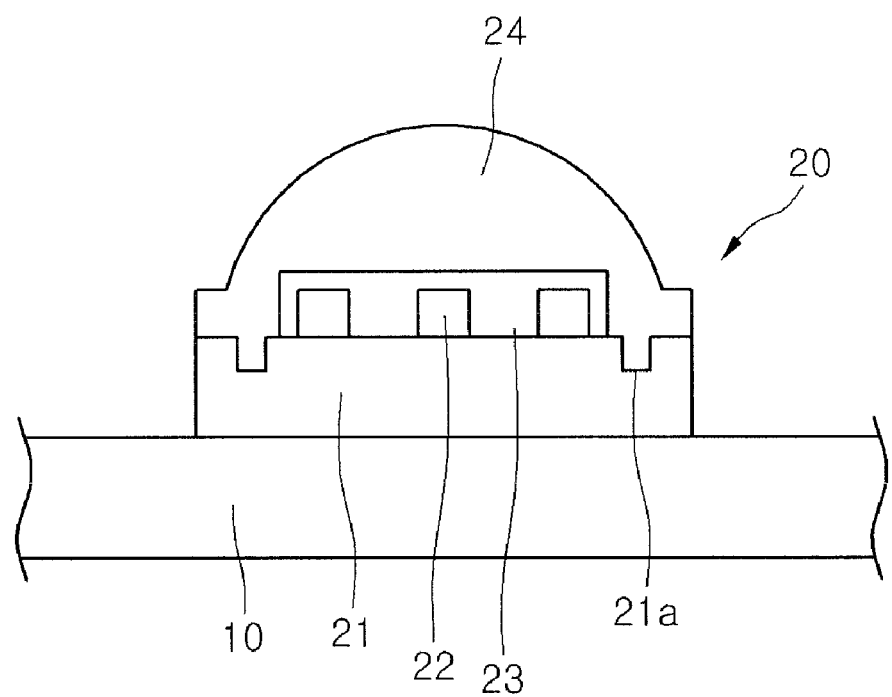
FIG. 6 is a sectional view of a light emitting device package in a light emitting apparatus according to a fifth embodiment.

FIG. 6 is a sectional view of a light emitting device package in a light emitting apparatus according to a fifth embodiment.

In descriptions of a light emitting apparatus according to a fifth embodiment, descriptions that duplicate those for the light emitting apparatus according to the first embodiment will be omitted.

Referring to FIG. 6, in a light emitting apparatus according to a fifth embodiment, a light emitting device package 20 has a groove 21*a* in a top surface of a package body 21. A sealing resin layer 24 is injected into the groove 21*a*. Thus, a contact area between the sealing resin layer 24 and the package body 21 increases to firmly couple the sealing resin layer 24 to the package body 21.

Although the groove 21*a* is defined in the top surface of the package body 21 in FIG. 6, the groove 21*a* may be defined in a lateral surface of the package body 21. Also, a protrusion instead of the groove 21*a* may be disposed.

Figure 7:
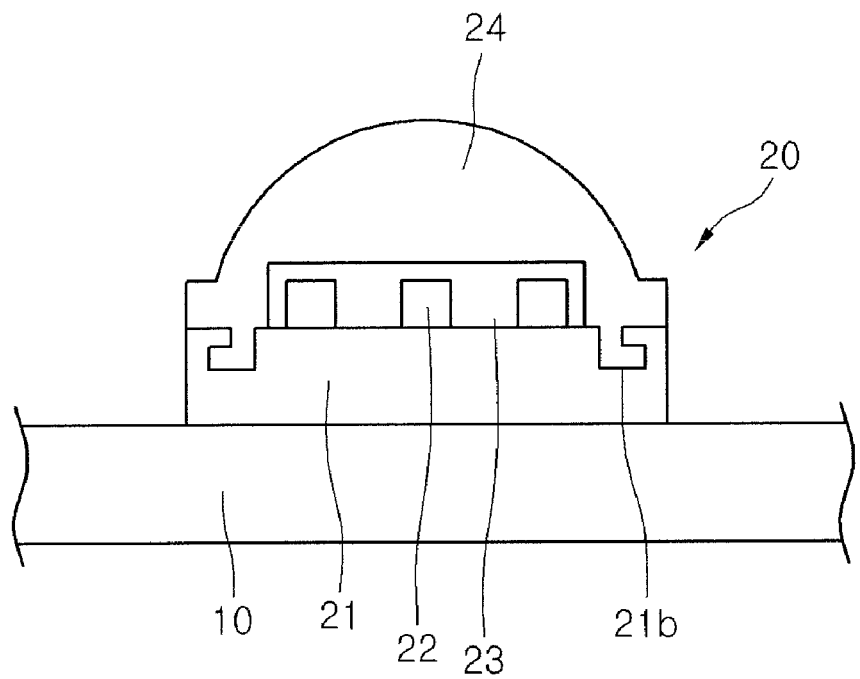
FIG. 7 is a sectional view of a light emitting device package in a light emitting apparatus according to a sixth embodiment.

FIG. 7 is a sectional view of a light emitting device package in a light emitting apparatus according to a sixth embodiment.

In descriptions of a light emitting apparatus according to a sixth embodiment, descriptions that duplicate those for the light emitting apparatus according to the first embodiment will be omitted.

Referring to FIG. 7, in a light emitting apparatus according to a sixth embodiment, a light emitting device package 20 has a double groove 21*b* in a top surface of the a package body 21. A sealing resin layer 24 is injected into the double groove 21*b*. The double groove 21*b* vertically extends downward from the top surface of the package body 21, and an end of the double groove 21*b* horizontally extends again. Thus, a contact area between the sealing resin layer 24 and the package body 21 increases. As a result, the sealing resin layer 24 within the double groove 21*b* serves as a hook part, the sealing resin layer 24 may be firmly coupled to the package body 21.

Figure 8:
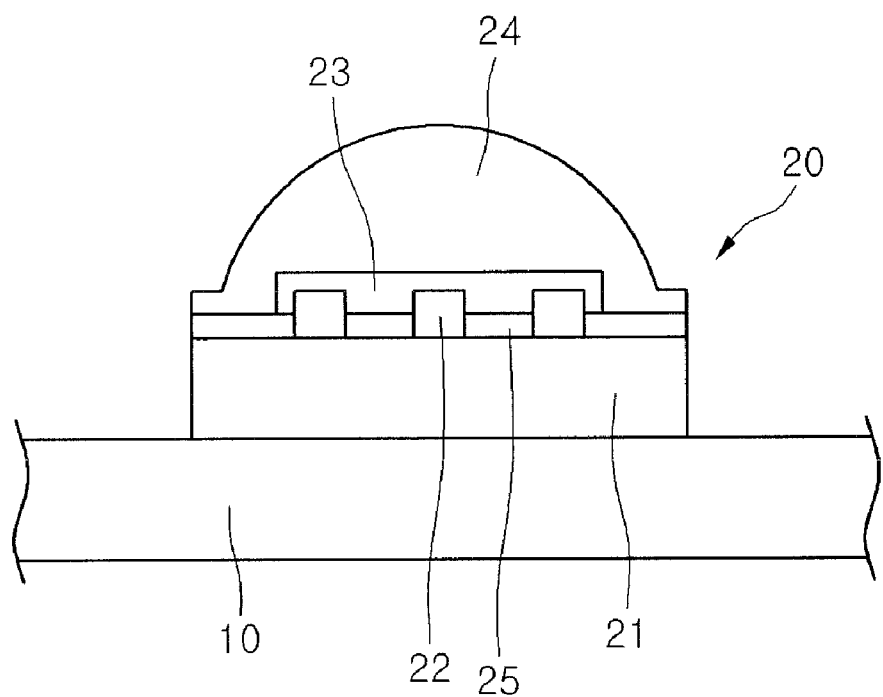
FIG. 8 is a sectional view of a light emitting device package in a light emitting apparatus according to a seventh embodiment.

FIG. 8 is a sectional view of a light emitting device package in a light emitting apparatus according to a seventh embodiment.

In descriptions of a light emitting apparatus according to a seventh embodiment, descriptions that duplicate those for the light emitting apparatus according to the first embodiment will be omitted.

Referring to FIG. 8, a light emitting apparatus according to a seventh embodiment, a light emitting device package 20 includes a reflection layer 25 on a top surface of a package body 21. The reflection layer 25 may be formed of a metal or an ink, which has a high reflectivity. The reflection layer 25 may reduce an amount of light absorbed into the package body 21 to improve light emitting efficiency of the light emitting apparatus.

As described above, the embodiments may provide the light emitting apparatus having a novel structure. Also, embodiments may provide the light emitting apparatus including the lens having a novel structure. Also, embodiments may provide the light emitting apparatus having the superior light emitting characteristic in the lateral direction.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus, comprising:
a substrate;
a light emitting device package on the substrate, the light emitting device package comprising:
   a package body provided on the substrate;
   at least one light emitting device provided on the package body;
   a phosphor layer surrounding the light emitting device; and
   a sealing resin layer provided on the phosphor layer and the package body; and
a lens supported by the substrate, the lens being disposed on the light emitting device package, wherein the lens comprises a lens body having a first recess at a central portion of a top surface thereof, a second recess at a central portion of a bottom surface thereof, and a lens support disposed on the bottom surface of the lens body to support the lens body such that the bottom surface of the lens body is spaced apart from the substrate.

2. The light emitting apparatus according to claim 1, wherein a ratio of a maximum depth of the first recess to a maximum thickness of the lens body ranges from about 0.06 to about 0.1, and a ratio of a maximum depth of the second recess to a maximum thickness of the lens body 31 ranges from about 0.5 to 0.75.

3. The light emitting apparatus according to claim 1, wherein a ratio of a maximum depth of the second recess to a maximum depth of the first recess ranges from about 6.25 to about 10.

4. The light emitting apparatus according to claim 1, wherein a ratio of a maximum width of the first recess to a maximum width of the lens body ranges from about 0.18 to about 0.3, and a ratio of a maximum width of the second recess to a maximum width of the lens body ranges from about 0.14 to about 0.25.

5. The light emitting apparatus according to claim 1, wherein a ratio of a maximum width of the second recess to a maximum width of the first recess ranges from about 0.7 to about 0.94.

6. The light emitting apparatus according to claim 1, wherein at least portion of the light emitting device package is disposed within the second recess.

7. The light emitting apparatus according to claim 1, wherein the first recess and the second recess vertically overlap each other.

8. The light emitting apparatus according to claim 1, wherein a plurality of lens supports spaced from each other is provided.

9. The light emitting apparatus according to claim 8, wherein at least three or more lens supports are provided.

10. The light emitting apparatus according to claim 1, wherein the lens body is flat at a circumference of a top surface thereof.

11. The light emitting apparatus according to claim 1, wherein the lens support adheres and is fixed to the substrate.

12. The light emitting apparatus according to claim 1, wherein a concave-convex part or roughness is disposed on the bottom surface of the lens body except for a portion where the second recess is formed.

13. The light emitting apparatus according to claim 1, wherein at least portion of the sealing resin layer is disposed within the second recess.

14. The light emitting apparatus according to claim 1, wherein the bottom surface of the lens body is flush with the package body.

15. The light emitting apparatus according to claim 1, wherein the bottom surface of the lens body is flush with the phosphor layer.

16. The light emitting apparatus according to claim 1, wherein the bottom surface of the lens body is flush with the light emitting device.

17. The light emitting apparatus according to claim 1, wherein the package body has a maximum thickness less than that of the lens support.

18. The light emitting apparatus according to claim 1, wherein the sealing resin layer contacts the substrate and a lateral surface of the package body.

19. The light emitting apparatus according to claim 1, wherein the phosphor layer has a top surface curved according to an arrangement of the light emitting device.

20. The light emitting apparatus according to claim 1, wherein the phosphor layer has a flat top surface.

21. The light emitting apparatus according to claim 1, wherein the phosphor layer has a convex top surface.

22. The light emitting apparatus according to claim 1, wherein the package body has a groove or a double groove, and the sealing resin layer is disposed within the groove or the double groove.

23. The light emitting apparatus according to claim 1, wherein a reflection layer is disposed on a top surface of the package body.

* * * * *